United States Patent
Ogiwara et al.

(10) Patent No.: US 8,045,358 B2
(45) Date of Patent: Oct. 25, 2011

(54) NONVOLATILE SEMICONDUCTOR MEMORY DEVICE

(75) Inventors: Ryu Ogiwara, Yokohama (JP); Daisaburo Takashima, Yokohama (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 54 days.

(21) Appl. No.: 12/635,590

(22) Filed: Dec. 10, 2009

(65) Prior Publication Data

US 2010/0149850 A1   Jun. 17, 2010

(30) Foreign Application Priority Data

Dec. 11, 2008 (JP) .................. 2008-315905

(51) Int. Cl.
*G11C 11/22* (2006.01)
(52) U.S. Cl. .............. 365/145; 365/65; 365/189.09
(58) Field of Classification Search .............. 365/145, 365/149, 65, 185.2, 189.07, 189.09
See application file for complete search history.

(56) References Cited

U.S. PATENT DOCUMENTS

| | | | | |
|---|---|---|---|---|
| 5,524,093 A | * | 6/1996 | Kuroda ................ | 365/145 |
| 6,566,698 B2 | * | 5/2003 | Nishihara et al. ....... | 257/295 |
| 6,664,118 B2 | * | 12/2003 | Nishihara et al. ....... | 438/3 |
| 6,822,891 B1 | * | 11/2004 | Hoya et al. ........... | 365/145 |
| 7,092,274 B2 | * | 8/2006 | Hoya et al. ........... | 365/145 |
| 7,092,304 B2 | | 8/2006 | Ogiwara et al. | |
| 7,589,513 B2 | | 9/2009 | Ogiwara et al. | |
| 2007/0274138 A1 | | 11/2007 | Ogiwara et al. | |

FOREIGN PATENT DOCUMENTS

| | | |
|---|---|---|
| JP | 2007-280458 | 10/2007 |
| JP | 2007-280458 A | 10/2007 |

OTHER PUBLICATIONS

Background Art Information.

* cited by examiner

*Primary Examiner* — Gene N. Auduong
(74) *Attorney, Agent, or Firm* — Knobbe Martens Olson & Bear LLP (57) ABSTRACT

According to an aspect of the present invention, there is provided a nonvolatile semiconductor memory device including: a memory cell array including: memory cell blocks each having series-connected memory cells; wordlines; and a bitline pair connected to the memory cell blocks, one functioning as a readout bitline, the other one functioning as a reference bitline; an amplification circuit connected to the bitline pair to amplify a signal difference therebetween; and a reference voltage generation circuit including: a dummy memory cell block that has the same configuration as the memory cell block, that has one terminal connected to a first dummy plate line and that has the other terminal connected to the reference bitline; and a paraelectric capacitor that has one terminal connected to a second dummy plate line and that has the other terminal connected to the reference bitline.

19 Claims, 10 Drawing Sheets

VDCA=0.9×VAA、VDC1=VREFDC

NONVOLATILE SEMICONDUCTOR MEMORY DEVICE

CROSS-REFERENCE TO RELATED APPLICATIONS

This application claims priority from Japanese Patent Application No. 2008-315905 filed on Dec. 11, 2008 the entire contents of which are incorporated herein by reference.

BACKGROUND OF THE INVENTION

1. Field of the Invention

An aspect of the present invention relates to a nonvolatile semiconductor memory device.

2. Description of the Related Art

For the ferroelectric random access memory, a 1T1C (1 transistor and 1 capacitor) type memory cell is proposed as it is suitable for increasing memory capacity.

The 1T1C type memory cell stores 1-bit data using one transistor and one capacitor, and a data readout is performed by comparing a readout voltage of a memory cell with a reference voltage.

The readout voltage of a memory cell is readout to a bitline, while the reference voltage is readout to a complementary bitline paired therewith. Then, the readout voltage and the reference voltage are compared by amplifying the difference therebetween using a sense amplifier.

In order to generate the reference voltage, a dummy cell including a selection transistor and a dummy capacitor is provided independently from an ordinary memory cell provided for storing data.

It is pointed out that a voltage applied between both electrodes of the dummy capacitor needs setting so as to have not only positive dependence on a temperature but also dependence on an array voltage VAA that is an internal voltage obtained by lowering a power-supply voltage in a chip and that is an operating voltage of the sense amplifier (see, e.g., JP-2007-280458-A).

In JP-2007-280458-A, a reference voltage generation circuit having both the temperature dependence and the array-voltage dependence includes a first current generation circuit configured to generate a first current having an intensity that is constant regardless of a power-supply voltage when temperature is constant and that varies according to change in temperature when temperature changes, a second current generation circuit configured to generate a second current depending on the power-supply voltage, and an output circuit configured to have a resistive element for applying a third current generated by adding the first current and the second current and to output an output voltage generated due to a voltage drop of the resistive element.

In the reference voltage generation circuit, dependence on the array voltage VAA and dependence on temperature T are controlled independently from each other so as to maintain a voltage applied between both electrodes of a dummy capacitor always at an appropriate value to thereby increase a sense margin.

However, in the reference voltage generation circuit of JP-2007-280458-A, the circuit is complicated, and that it is troublesome to adjust the temperature dependence of the voltage to be applied to the dummy capacitor to the temperature dependence of a ferroelectric capacitor.

In addition, in the reference voltage generation circuit of JP-2007-280458-A, if temperature unevenness is caused in a semiconductor chip and if a place where the reference voltage generation circuit is disposed and a place where the dummy capacitor is disposed are spaced from each other, a deviation of the voltage to be applied to the dummy capacitor from an appropriate value and a decrease in the sense margin may occur.

SUMMARY OF THE INVENTION

According to an aspect of the present invention, there is provided a nonvolatile semiconductor memory device including: a memory cell array including: a plurality of memory cell blocks each having a plurality of memory cells that are series-connected; a plurality of wordlines connected to the memory cells of the memory cell blocks; and a bitline pair connected to the memory cell blocks, one of the bitline pair functioning as a readout bitline, the other of the bitline pair functioning as a reference bitline; an amplification circuit connected to the bitline pair to amplify a signal difference therebetween; and a reference voltage generation circuit including: a first dummy cell having a dummy memory cell block that has the same configuration as the memory cell block, that has one terminal connected to a first dummy plate line and that has the other terminal connected to the reference bitline of the bitline pair; and a second dummy cell having a paraelectric capacitor that has one terminal connected to a second dummy plate line and that has the other terminal connected to the reference bitline of the bitline pair.

According to another aspect of the present invention, there is provided a nonvolatile semiconductor memory device including: a semiconductor substrate including a first region and a second region; a memory cell array including: a plurality of memory cell blocks each having a plurality of memory cells that are series-connected; a plurality of wordlines connected to the memory cells of the memory cell blocks; and a bitline pair connected to the memory cell blocks, one of the bitline pair functioning as a readout bitline, the other of the bitline pair functioning as a reference bitline; an amplification circuit connected to the bitline pair to amplify a signal difference therebetween; and a reference voltage generation circuit including: a first dummy cell having a first paraelectric capacitor that has one terminal connected to a first dummy plate outputting a first dummy plate voltage varying depending on temperatures of the first and the second regions and that has the other terminal connected to the reference bitline of the bitline pair; and a second dummy cell having a second paraelectric capacitor outputting a second dummy plate voltage varying depending on an array voltage and that has the other terminal connected to the reference bitline of the bitline pair.

DETAILED DESCRIPTION OF THE INVENTION

Hereinafter, embodiments of the invention are described with reference to the accompanying drawings.

Embodiment 1

Figure 1:
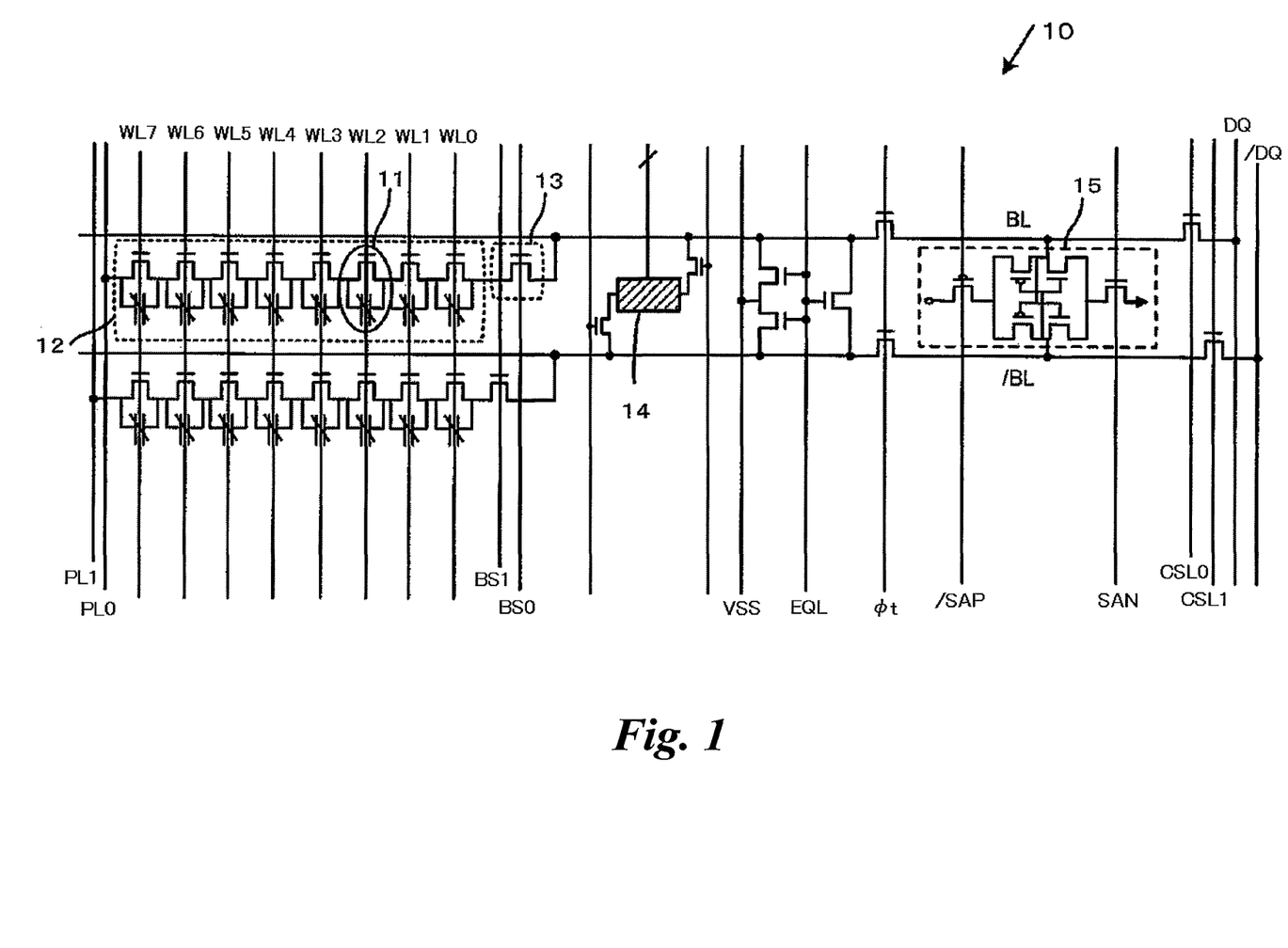
FIG. 1 illustrates a nonvolatile semiconductor memory device according to Embodiment 1.
Figure 2:
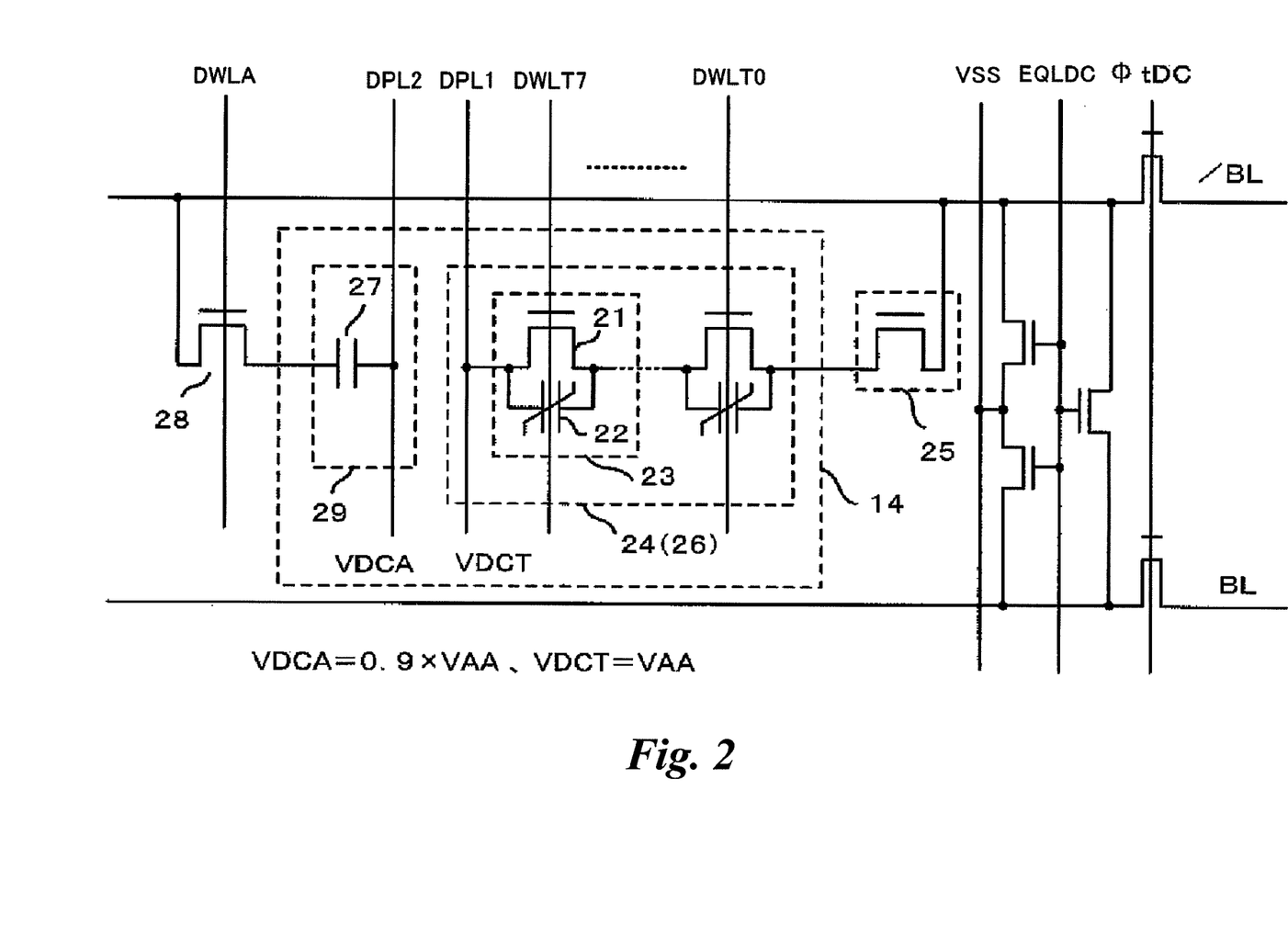
FIG. 2 illustrates a reference voltage generation circuit of the nonvolatile semiconductor memory device according to Embodiment 1.

A nonvolatile semiconductor memory device according to Embodiment 1 is described below with reference to FIGS. 1 and 2. FIG. 1 illustrates a nonvolatile semiconductor memory device according to the present embodiment. FIG. 2 illustrates a reference voltage generation circuit of the nonvolatile semiconductor memory device.

First, configuration and operation of a nonvolatile semiconductor memory device 10 are exemplarily described below.

As illustrated in FIG. 1, one memory cell 11 includes a cell transistor and a ferroelectric capacitor, which are connected in parallel to each other. One memory cell block 12 includes a plurality (8, in this embodiment) of the memory cells 11, which are connected in series. One terminal of the memory cell block 12 is connected to a bitline BL via a block selection transistor serving as a block selector 13, while the other terminal of the memory cell block 12 is connected to a plate line PL0.

Two of block selection transistors are provided for a bitline BL and a reference bitline /BL, respectively. And, two types of block selection signals BS0 and BS1 are supplied to the block selection transistors, respectively. When one of the block selection signals BS0 and BS1 is set at "H", only data stored in the corresponding memory cell block is readable to the bitline BL. The other of the bitline pair is used as a reference bitline /BL. Thus, a 1T1C cell for storing 1-bit data is constructed by one cell transistor and one ferroelectric capacitor.

Two types of plate lines PL0 and PL1 are prepared to thereby drive only the plate line corresponding to the selected bitline. For example, it is possible to stop a voltage application to a reference-side non-selected cell.

At a standby time, all word lines WL0 to WL7 are set at "H" to turn on memory cell transistors, and the block selection signals BS0 and BS1 are set at "L" to preliminarily turn off the block selection transistors.

Consequently, since both terminals of the ferroelectric capacitor are electrically short-circuited by the turned-on cell transistor so that no voltage difference between both the terminals is caused, memory polarization is stably held.

At an active time, the bitline pair that have been precharged to Vss is brought into a floating state. Next, only the cell transistor connected in parallel to the reading-target ferroelectric capacitor is turned off. Thus, the associated block selection transistor is turned on.

For example, when the ferroelectric capacitor of a memory cell 11 is selected, only the wordline WL2 is set at level "L". Subsequently, the plate line PL0 is set at level "H", and the block selection signal BS0 is set at level "H". The voltage difference between the plate line PL0 and the bitline BL is applied only between both terminals of the ferroelectric capacitor that is connected in parallel to the turned-off cell transistor. Thus, information on the polarization of the ferroelectric capacitor is read to the bitline BL that has been precharged to Vss and then made to a floating state.

When data "1" is written to the ferroelectric capacitor, the polarization inversion is caused, and the bitline BL is set at a high voltage level. On the other hand, when data "0" is written to the ferroelectric capacitor, although the polarization inversion thereof does not occur, the voltage level of the bitline BL is raised by a degree corresponding to the ratio between the paraelectric component of the ferroelectric capacitor and the bitline capacitance.

Although the voltage of the bitline BL is raised from Vss in both the cases of writing data "0" and of writing data "1", the voltage levels respectively corresponding to both the cases are different from each other. Therefore, by setting the voltage of the reference bitline /BL at an intermediate voltage level using a reference voltage generation circuit 14, and by amplifying the voltage difference between the bitline BL and the reference bitline /BL using a sense amplification circuit 15, it is determined whether cell data is "1" or "0".

The reference voltage generation circuit 14 includes a dummy cell having a capacitor for generating reference voltage, as will be described below. One terminal of the capacitor is connectable to the bitline BL or to the reference bitline /BL, while the other terminal thereof is connected to a dummy word line and a dummy plate line.

The sense amplification circuit 15 includes a P-type sense amplifier having two P-channel metal oxide semiconductor (PMOS) transistors, and an N-type sense amplifier having two N-channel MOS (NMOS) transistors. The sense amplification circuit 15 is controlled by control signals /SAP and SAN to turn on and off.

Next, an example of a voltage (hereinafter referred to as a reference voltage VDC) that is to be applied between the capacitor of the dummy cell and that is imparted with not only positive temperature dependence but also an array voltage VAA dependence is described below.

Figure 3A:
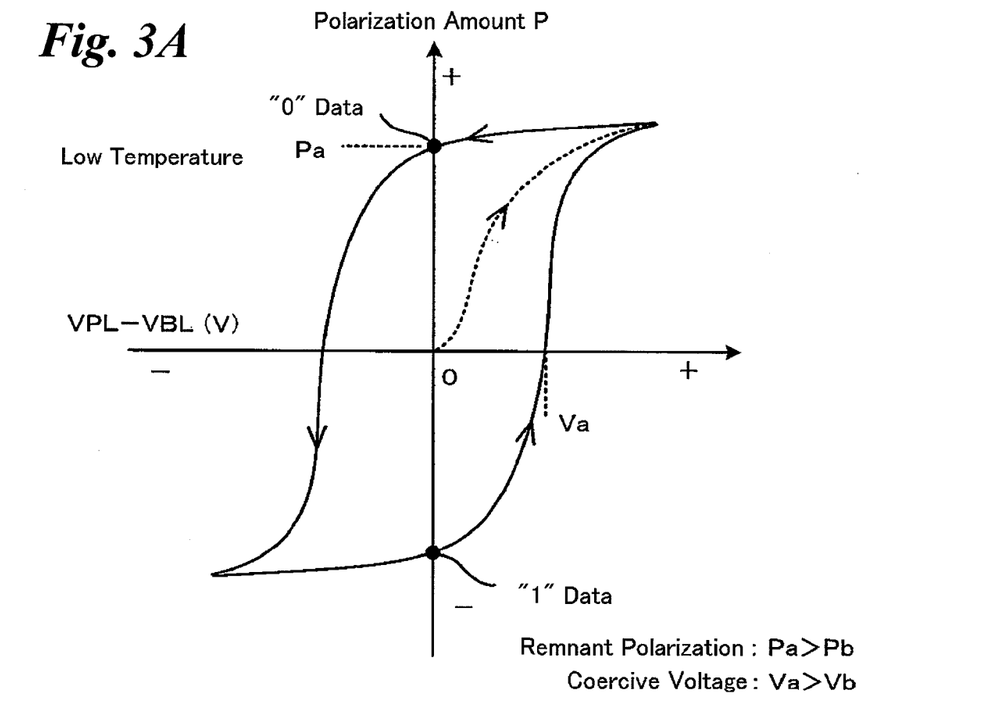
FIGS. 3A and 3B illustrate polarization characteristics of a ferroelectric capacitor of the nonvolatile semiconductor memory device according to Embodiment 1, FIG. 3A illustrating the polarization characteristic at low temperature, FIG. 3B illustrating the polarization characteristic at high temperature.
Figure 3B:
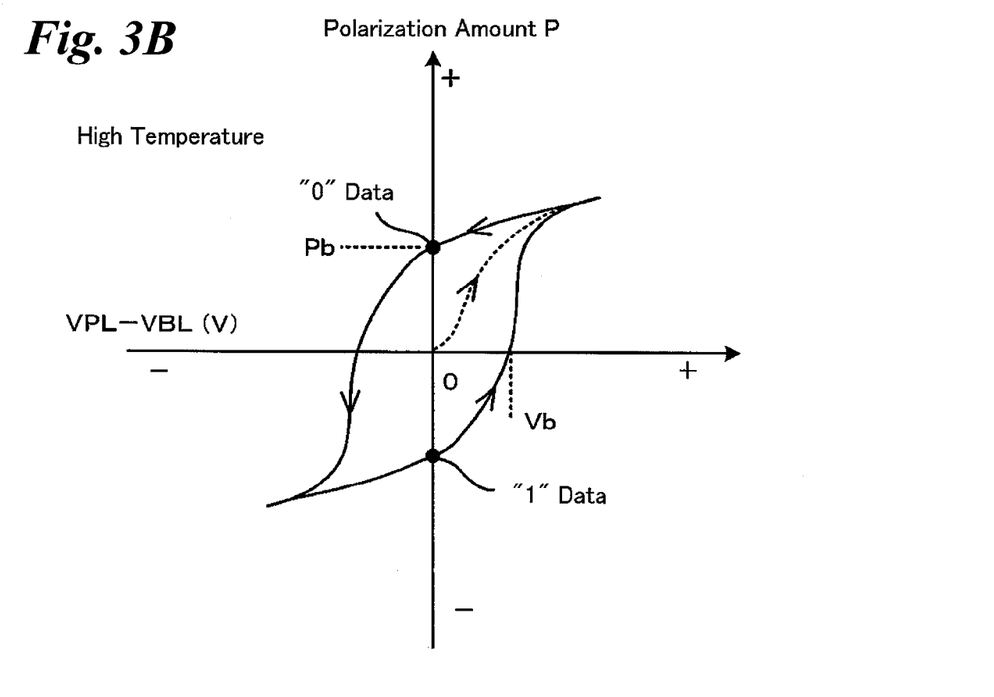
Figure 4:
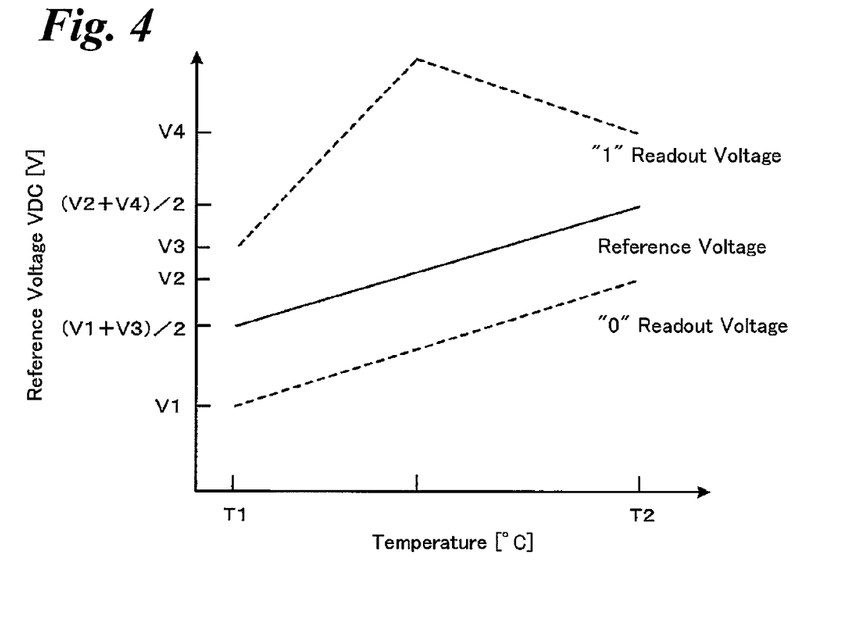
FIG. 4 illustrates the temperature dependence of a reference voltage VDC of the nonvolatile semiconductor memory device according to Embodiment 1.
Figure 5:
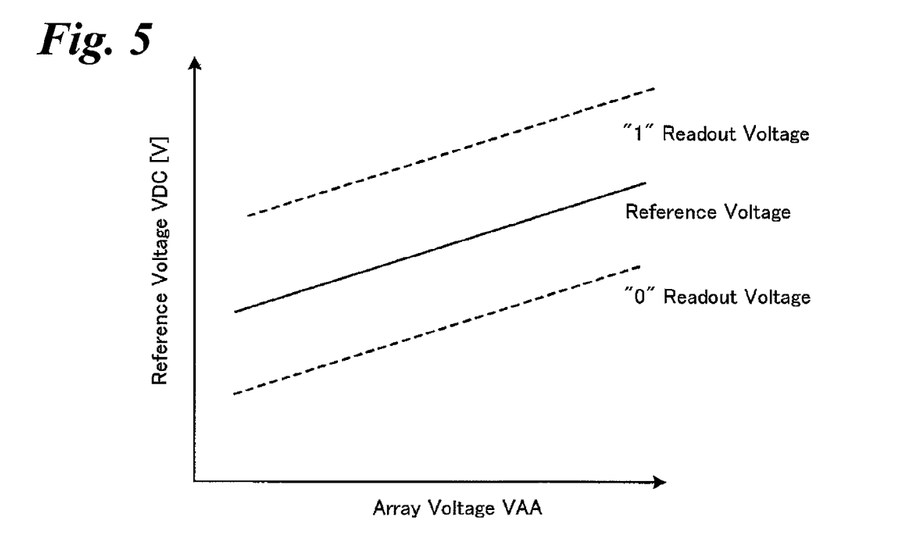
FIG. 5 illustrates the array-voltage dependence of a reference voltage VDC of the nonvolatile semiconductor memory device according to Embodiment 1.

FIGS. 3A and 3B illustrate polarization characteristics of the ferroelectric capacitor. FIG. 3A illustrates the polarization characteristic at low temperature. FIG. 3B illustrates the polarization characteristic at high temperature. FIG. 4 illustrates the temperature dependence of the reference voltage VDC. FIG. 5 illustrates the array-voltage dependence of a reference voltage VDC of the nonvolatile semiconductor memory device.

As illustrated in FIGS. 3A and 3B, when a voltage (VPL−VBL) (i.e., the difference between a plate line voltage VPL and a bitline voltage VBL) is applied to the ferroelectric capacitor in an initial state, in which the ferroelectric capacitor is not polarized, polarization thereof occurs. The polarization exhibits hysteresis according to the voltage applied thereto. However, when temperature rises, remnant polarization is decreased from Pa to Pb, and a coercive voltage is decreased from Va to Vb.

When data "1" is written to the ferroelectric capacitor, that is, when the ferroelectric capacitor is reversely polarized, the voltage difference between the electrodes of the ferroelectric capacitor is small since the capacity thereof is large. Thus, the voltage of the connection portion is high, and the readout voltage of data "1" is high.

When data "0" is written to the ferroelectric capacitor, that is, when the ferroelectric capacitor is non-reversely polarized, the voltage difference between the electrodes of the ferroelectric capacitor is large since the capacity thereof is small. Thus, the voltage of a connection portion is low, and the readout voltage of data "0" is low.

FIG. 4 illustrates characteristics in which the "0" readout voltage increases with the rise of temperature, and in which the "1" readout voltage, although it first increases, decreases with the rise of temperature thereafter.

The increase in the "0" readout voltage and the decrease in the "1" readout voltage from the middle stage result from a decrease of the remnant polarization amount of the ferroelectric capacitor with the rise of temperature.

The increase of the "1" readout voltage in the first stage results from a decrease of the coercive voltage of the ferroelectric capacitor with the rise of temperature.

Accordingly, in this embodiment, when the voltage difference between the bitline pair is amplified using the sense amplification circuit 15, temperature dependence is imparted to the reference voltage VDC that is to be applied to one of the bitline pair as a reference voltage.

For example, the reference voltage VDC is set to low value at low temperature, and is set to high value at high temperature. In order to maximally ensure a margin between the sense amplifier reference voltage and both of the "L" signal voltage and the "H" signal voltage within the given temperature range, the temperature dependence is imparted so that the sense amplifier reference voltage draws a straight line connecting the average value (V1+V3)/2 of the "0" readout voltage V1 and the "1" readout voltage V3 at the lowest temperature T1 and the average value (V2+V4)/2 of the "0" readout voltage V2 and the "1" readout voltage V4 at the highest temperature T2.

As illustrated in FIG. 5, the "0" readout voltage and the "1" readout voltage increase or decrease according to the array voltage VAA. In the embodiment, array voltage dependence is imparted to the reference voltage VDC, thereby suppressing influence of the variation of the array voltage VAA.

For example, similar to the temperature dependence, the reference voltage VDC is set to low value at low voltage, and is set to high value at high voltage. Within a given specific voltage range, the reference voltage VDC is set to draw a straight line connecting the average value of the "0" and "1" readout voltages at the lowest voltage and the average value of the "0" and "1" readout voltages at the highest voltage.

In the embodiment, the sense margin of the sense amplification circuit 15 is stably ensured by increasing and decreasing the reference voltage VDC depending on not only temperature but also on the array voltage.

Next, the reference voltage generation circuit 14 is described below.

As illustrated in FIG. 2, the reference voltage generation circuit 14 includes a first dummy cell 26 having a memory cell block 24. The memory cell block 24 has the same configuration as the configuration of the memory cell block 12, and includes a plurality of series-connected memory cells 23 each of which has a cell transistor 21 and a ferroelectric capacitor 22 connected between the source and the drain of the cell transistor 21 in parallel therewith. One terminal of the memory cell block 12 is connected to a first dummy plate line DPL1 having a first dummy plate voltage VDCT, and the other terminal thereof is connected to a reference bitline /BL via a block selector 25.

The reference voltage generation circuit 14 further includes a second dummy cell 29 having a paraelectric capacitor 27. One terminal of the paraelectric capacitor 27 is connected to a second dummy plate line DPL2 having a second dummy plate voltage VDCA, and the other terminal thereof is connected to the reference bitline /BL via a selection transistor 28. The second dummy plate voltage VDCA varies depending on an array voltage VAA.

For example, data "0" is written to the memory cell 23 of the first dummy cell 26 at all times before the data readout. More specifically, the first dummy plate voltage VDCT is set to be equal to the array voltage VAA, a signal ΦtDC is set "L" to turn off the transistor to thereby separate the memory cell side from the sense amplifier side, and an equalization signal EQLDC is set "H" to turn on the transistor to thereby precharge the ferroelectric capacitor 22 to data "0".

Since the first dummy cell 26 itself has the same temperature dependence as that of the memory cell block 12, it is not necessary to impart the temperature dependence to the first dummy plate voltage VDCT. It is considered appropriate to set the first dummy plate voltage VDCT to be equal to the array voltage VAA.

The second dummy plate voltage VDCA is imparted with the array voltage VAA dependence so as to be k times the array voltage VAA (0<k<1). Results of various studies of the balance between the temperature dependence and the array voltage (VAA) dependence of the reference voltage reveal that an appropriate range for value of k is around 0.8 to 0.95. More specifically, an appropriate value of k is about 0.9.

Figure 6:
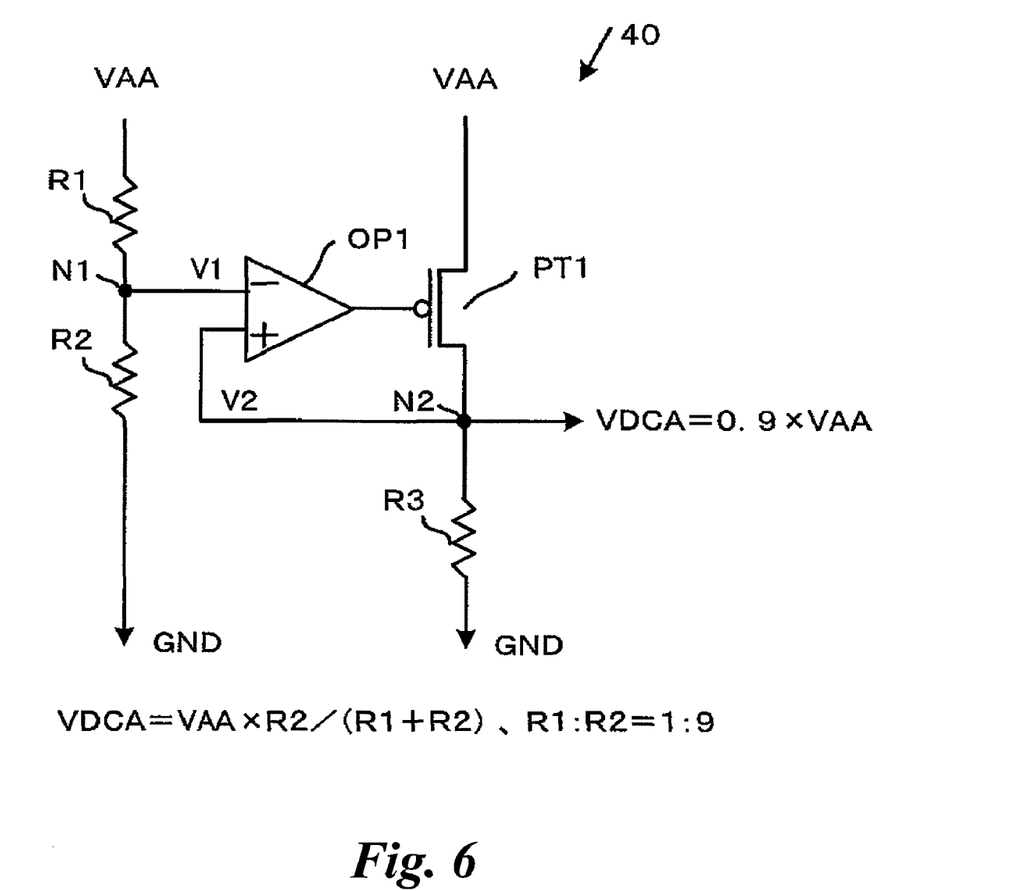
FIG. 6 illustrates a VDCA generation circuit of the nonvolatile semiconductor memory device according to Embodiment 1.

FIG. 6 illustrates a VDCA generation circuit for generating the second dummy plate voltage VDCA. As illustrated in FIG. 6, a VDCA generation circuit 40 divides the array voltage VAA by resistors R1 and R2 to generate a reference voltage which is input to a negative feedback circuit of an operational amplifier OP1 and a PMOS transistor PT1 to thereby generate the second dummy plate voltage VDCA.

The VDCA generation circuit 40 is controlled such that a voltage V1 at a node N1 is equal to a voltage V2 at a node N2. Thus, the second dummy plate voltage VDCA generated by dividing the array voltage VAA by the resistors R1 and R2 is stably obtained. The second dummy plate voltage VDCA can easily be changed, for example, by changing a ratio of the resistors R1 and R2.

According to the present embodiment, a sum of a reference charge depending on temperature, and a reference charge corresponding to 0.9 times (for example) the array voltage VAA, is supplied to the reference bitline /BL.

Since the memory cell 23 of the first dummy cell 26 has the same configuration as that of the memory cell 11 that stores information, the same voltage as the readout voltage of data "0" is be obtained. Consequently, the reference voltage VDC can be imparted with the temperature dependence corresponding to the memory cell 11.

The paraelectric capacitor 27 of the second dummy cell 29 is precharged by the second dummy plate voltage VDCA which is proportional to the array voltage VAA. Thus, the array voltage (VAA) dependence can be imparted to the reference voltage VDC by reading data stored in the second dummy cell 29.

Next, an operation of the reference voltage generation circuit 14 is more specifically described below.

In the first dummy cell 26, at a standby time, all the first wordlines DWLT0 to DWLT7 are set "H" to turn on the cell transistor 21. And, the block selector 25 is turned off.

Consequently, since both terminals of the ferroelectric capacitor 22 are electrically short-circuited by the cell transistor 21 turned on to thereby generate no voltage difference therebetween, data "0" can stably be stored.

At an active time, the bitline pair BL and /BL preliminarily precharged to Vss is put into a floating state, only the cell transistor 21 connected in parallel to the reading-target ferroelectric capacitor 22 is turned off, and the block selector 25 is turned on.

For example, when the ferroelectric capacitor 22 of the memory cell 23 is selected as shown in FIG. 2, corresponding first wordline DWLT7 is set "L". Subsequently, the first dummy plate line DPL1 is set "H". A block selection signal (not shown) is set "H". Consequently, the voltage difference between the first dummy plate line DPL1 and the reference bitline /BL is applied only to both terminals of the ferroelectric capacitor 23 connected in parallel to the turned-off transistor 21. Information on the polarization of the ferroelectric capacitor 22 is read to the reference bitline /BL in the floating state after being precharged to Vss.

In the second dummy cell 29, at a standby time, since the second dummy wordline DWLA is set "L" to turn off the selection transistor 28, and the paraelectric capacitor 27 (whose capacity C2) is precharged to the second dummy plate voltage VDCA. That is, an electric charge of C2×VDCA is stored in the paraelectric capacitor 28.

At an active time, the second dummy wordline DWLA is set at level "H" to turn on the selection transistor 28, and the paraelectric capacitor 27 is connected to the reference bitline /BL. Electric charge stored in the paraelectric capacitor 27 is discharged to the reference bitline /BL side.

That is, electric charges of the ferroelectric capacitor 22 and of the paraelectric capacitor 27 are distributed into the reference bitline /BL, the ferroelectric capacitor 22 and the paraelectric capacitor 27.

More specifically, the voltage of the reference bitline /BL is set to a value obtained by dividing a total electric charge of the ferroelectric capacitor 22 and the paraelectric capacitor 27 by load capacity (including reference bitline capacity, and the capacity of the ferroelectric capacitor 22 and that of the paraelectric capacitor 27). Thus, the voltage of the reference bitline /BL can be increased to an intermediate value between the voltages corresponding to data "1" and "0".

As described above, the reference voltage generation circuit 14 of the nonvolatile semiconductor memory device 10 according to the present embodiment includes the first dummy cell 26 configured to have the memory cell block 24 which is of the same configuration as the configuration of the memory cell block 12, so that one terminal of the memory cell block 24 is connected to the first dummy plate line DPL1 having the first dummy plate voltage VDCT while the other terminal of the memory cell block 24 is connected to the reference bitline /BL via the block selector 25, and includes also the second dummy cell 29 configured to have the paraelectric capacitor 27 so that one terminal of the paraelectric capacitor 27 is connected to the second dummy plate line DPL2 having the second dummy plate voltage VDCA according to the array voltage VAA and that the other terminal of the paraelectric capacitor 27 is connected to the reference bitline /BL via the selection transistor 28.

Consequently, it is possible to apply a sum of the temperature-dependent reference charge from the first dummy cell 26 and the array-voltage-VAA-proportional reference charge from the second dummy cell 29 to the reference bitline /BL.

Accordingly, there is provided the nonvolatile semiconductor memory device including the power-supply voltage dependence and the temperature dependence.

Operating temperature range of the nonvolatile semiconductor memory device 10 according to the embodiment is, for example, set to −40 to 80 [° C.].

Embodiment 2

Figure 7:
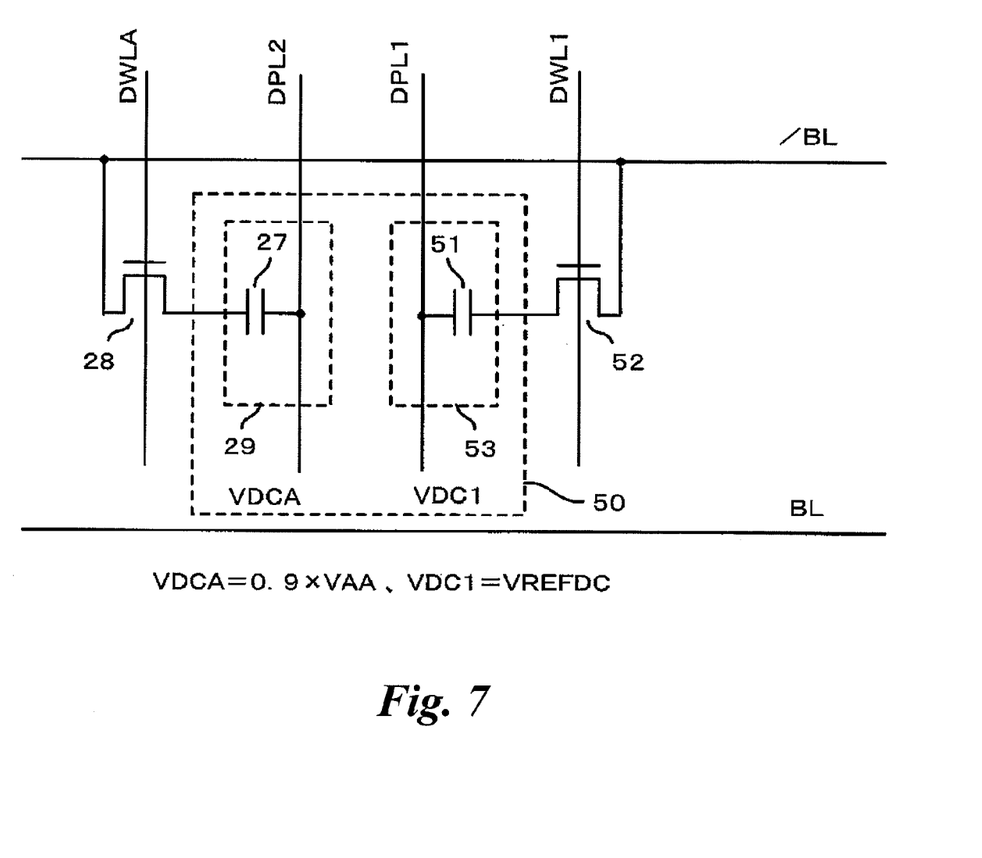
FIG. 7 illustrates a reference voltage generation circuit of the nonvolatile semiconductor memory device according to Embodiment 2.
Figure 8:
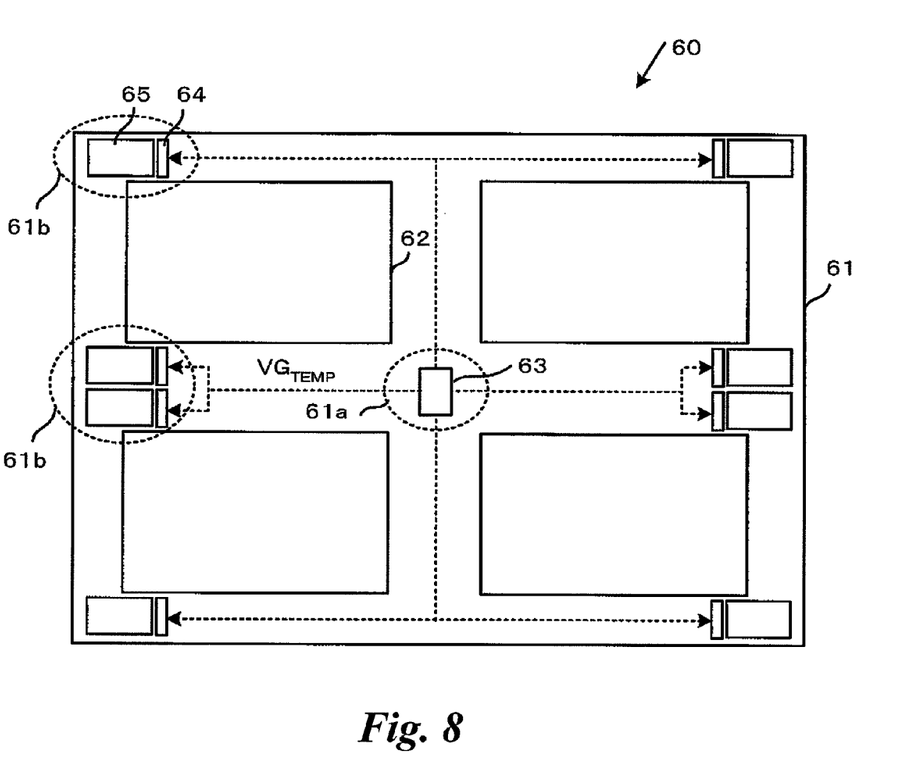
FIG. 8 illustrates a semiconductor chip on which the nonvolatile semiconductor memory device according to Embodiment 2 is formed.

A nonvolatile semiconductor memory device according to Embodiment 2 is described with reference to FIGS. 7 and 8. FIG. 7 illustrates a reference voltage generation circuit of the nonvolatile semiconductor memory device according to present embodiment. FIG. 8 illustrates a semiconductor chip on which the nonvolatile semiconductor memory device is formed.

In the following description of the present embodiment, each composing portion which is the same as that of the Embodiment 1, is designated with the same reference numeral with which the associated composing portion according to the Embodiment 1 is designated. Thus, the description of such composing portions is omitted. Only composing portions according to Embodiment 2, which differ from those according to the Embodiment 1, are described below.

Embodiment 2 differs from the Embodiment 1 in that temperature-dependent reference charge is generated by a paraelectric capacitor and that when, a temperature distribution is caused in the semiconductor chip, a reference voltage VDC is automatically adjusted according to each location.

As illustrated in FIG. 7, a reference voltage generation circuit 50 of the nonvolatile semiconductor device according to Embodiment 2 includes a first dummy cell 53. The first dummy cell includes a paraelectric capacitor (first paraelectric capacitor) 51. One terminal of the paraelectric capacitor 51 is connected to a first dummy plate line DPL1 having a first dummy plate voltage VDC1, and the other terminal thereof is connected via a selection transistor 52 to a reference bitline /BL from which data stored in a memory cell is not read. The first dummy plate voltage VDC1 depends on both the temperature of a first region of the semiconductor chip and the temperature of a second region spaced from the first region. The reference voltage generation circuit 50 includes also the aforementioned second dummy cell 29.

As illustrated in FIG. 8, a semiconductor chip 61, on which a nonvolatile semiconductor memory device 60 is formed, includes the memory cell arrays 62 disposed at four places on the semiconductor chip 60. Each memory cell array 62 includes a plurality of memory cell blocks 12 each of which has a plurality of memory cells 11 each including a cell transistor and a ferroelectric capacitor connected in parallel therewith, a plurality of wordlines WL1 to WL7 respectively connected to the cell transistors, and a bitline pair BL and /BL connected to each memory cell block 12.

A first voltage generation circuit 63 for generating a first voltage is disposed on a first region (central portion in this embodiment, for example) 61a of the semiconductor chip 61. The first voltage generation circuit 63 generates the first voltage to depend on the temperature of the central portion 61a. A second voltage generation circuit 64 for generating a second voltage and a third voltage generation circuit 65 for generating a first dummy plate voltage VDC1 are respectively disposed on second regions (peripheral portions in this embodiment, for example) 61b of the semiconductor chip 61 so as to adjoin the corresponding memory cell array 62. The second voltage is obtained by imparting the temperature dependence of the peripheral portion 61b to the first voltage, and the first dummy plate voltage VDC1 is provided according to the second voltage.

Each peripheral portion 61b includes an associated one of four corners and associated ones of sides of the semiconductor chip 61. According to the present embodiment, the second voltage generation circuit 64 and the third voltage generation circuit 65 are disposed at each of the four corners of the semiconductor chip 61 and intermediate portions between a pair of opposed sides thereof.

The first voltage generation circuit 63 is a band gap reference (BGR) generation circuit that generates a constant current regardless of the array voltage VAA when temperature is constant, and that changes the intensity of the current according to variation of temperature when temperature varies.

In this embodiment, in the semiconductor chip 61, the temperature-dependence VBGR voltage is generated from the VBGR generation circuit 63 disposed at the central portion 61a, and a VGTEMP voltage (first voltage) is supplied to the second voltage generation circuit 64 disposed at each peripheral portion 61b.

The second voltage generation circuit 64 is a VREFDC generation circuit that outputs a VREFDC voltage (second voltage) obtained by imparting temperature dependence of the associated peripheral portion 61b to the VGTEMP voltage (first voltage) by configuring so that a threshold of a PMOS transistor receiving VGTEMP voltage is lowered and the intensity of current of the PMOS transistor increases when the temperature at the associated peripheral portion 61b is higher than the temperature at the central portion 61a.

The third voltage generation circuit 65 is a VDC generation circuit functioning as a buffer. The third voltage generation circuit 65 receives a VREFDC voltage (second voltage) and stably outputs a VDC voltage being adjusted into the first dummy plate voltage VDC1 with low impedance.

According to the present embodiment, even when a temperature distribution is caused at each place on the semiconductor chip 61, since a temperature-dependent VREFDC voltage for correcting the temperature distribution can be obtained with small area penalty, the sense margin can be prevented from being decreased.

Next, examples of the VBGR generation circuit 63, of the VREFDC generation circuit 64 and of the VDC generation circuit 65 are described hereinafter with reference to FIGS. 9 to 11.

Figure 9:
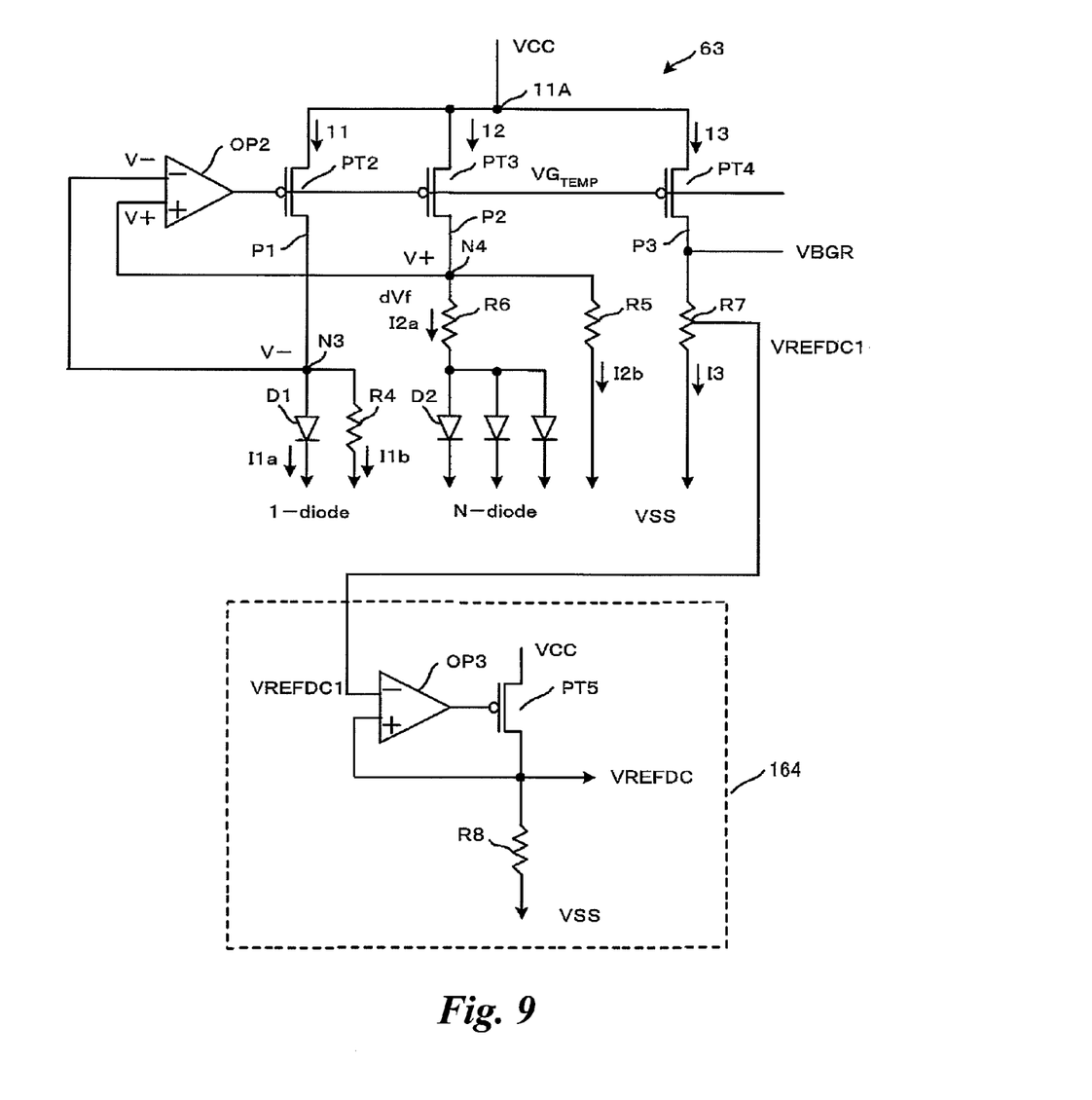
FIG. 9 illustrates a VBGR generation circuit of the nonvolatile semiconductor memory device according to Embodiment 2.

FIG. 9 illustrates the VBGR generation circuit 63. FIG. 10 illustrates the VREFDC generation circuit 64. FIG. 11 illustrates the VDC generation circuit 65.

As illustrated in FIG. 9, the VBGR generation circuit 63 includes an operational amplifier OP2. A first current path P1 including a PMOS transistor PT2, a diode D1, and a resistor R4 connected in parallel to the diode D1 is formed between an input terminal 11A, to which a high-side power supply voltage VCC is input, and ground voltage VSS.

A second current path P2 is formed to be connected in parallel to the first current path P1 by series-connecting a PMOS transistor PT3 and a resistor R5 and then by series-connecting a resistor R6 and parallel-connected N diodes D2 in parallel to the resistor R5.

A third current path P3 including a PMOS transistor PT4 is formed to be connected in parallel to the first current path P1 and the second current path P2. A resistor R7 is an output resistor through which an output voltage VBGR is obtained. A variable resistor may be used as the resistor R7 to obtain an output voltage VREFDC1 based on the output voltage VBGR.

Although a VREFDC generation circuit 164 is also shown in FIG. 9, the description therefor will be given later.

The PMOS transistors PT2, PT3 and PT4 have the same size. The gates of these PMOS transistors PT2, PT3 and PT4 are connected to an output terminal of the operational amplifier OP2 in common to thereby form a current mirror circuit. Consequently, currents I1 to I3 (I1=I2=I3) of the same intensity flow in the first to third current paths P1 to P3, respectively, such that a voltage V− at a node N3 between the PMOS transistor PT2 and the diode D1 is equal to a voltage V+ at a node N4 between the PMOS transistor PT3 and the resistor R5.

The voltage V− at the node N3 is input to an inverting input terminal of the operational amplifier OP2, and the voltage V+ at the node N2 is input to the non-inverting input terminal of the operational amplifier OP2.

When R4=R5, a current I1a flowing the diode D1, a current I1b flowing in the resistor R4 (I1=I1a+I1b), a current I2a flowing in the resistor R6, and a current I2b flowing in the resistor R5 (I2=I2a+I2b) satisfy the following conditions.

$$I1a = I2a, I1b = I2b,$$

$$V- = Vf1, V+ = Vf2 + dVf, \text{ and } dVf = Vf1 - Vf2$$

where Vf1 and Vf2 are the forward voltages of the diodes D1 and D2, respectively.

The voltage dVf between both terminals of the resistor R6 and the currents I2a and I2b satisfy the following equations.

$$I2a = dVf/R6, \text{ and } I2b = Vf1/R5.$$

Accordingly, the output currents I2 and I3 are obtained as follows.

$$I2 = I3 = I2a + I2b = Vf1/R5 + dVf/R6$$

This current I3 flows in a resistor R7. Thus, an output voltage VBGR (VREFDC1) is represented by the following equation.

$$VBGR = R7 \times (Vf1/R5 + dVf/R6)$$
$$= R7 \times (Vf1/R5 + VT/R6 \times \log N)$$

VT is a threshold of the diodes D1 and D2, and N is the number of the diodes D2. This current I3 and the output voltage VBGR are constant regardless of the power supply voltage (i.e., the array voltage VAA) when temperature T is constant.

Even when the temperature T changes, the temperature characteristic of the voltage Vf1 is −2 [mV/° C.], the temperature characteristic of the voltage VT is +0.086 [mV/° C.]. Thus, the current I3 and the output voltage VBGR can be made constant regardless of the temperature T and/or the power supply voltage (e.g., the array voltage VAA) by appropriately selecting resistance values R5 and R6. Alternatively, positive or negative temperature dependence can be imparted thereto.

For example, to generate the output voltage VBGR (VREFDC1) for the first dummy plate voltage VDC1, the resistance values R5 and R6 are selected to impart a positive temperature characteristic to the output voltage VBGR so that the voltage VBGR increases as temperature rises.

Thus, the VBGR generation circuit 63 can be controlled to generate a constant output current (I3) regardless of the power supply voltage (i.e., the array voltage VAA), and to change the intensity of the output current (I3) according to the temperature T when the temperature T changes, by appropriately adjusting the internal resistance thereof.

Figure 10:
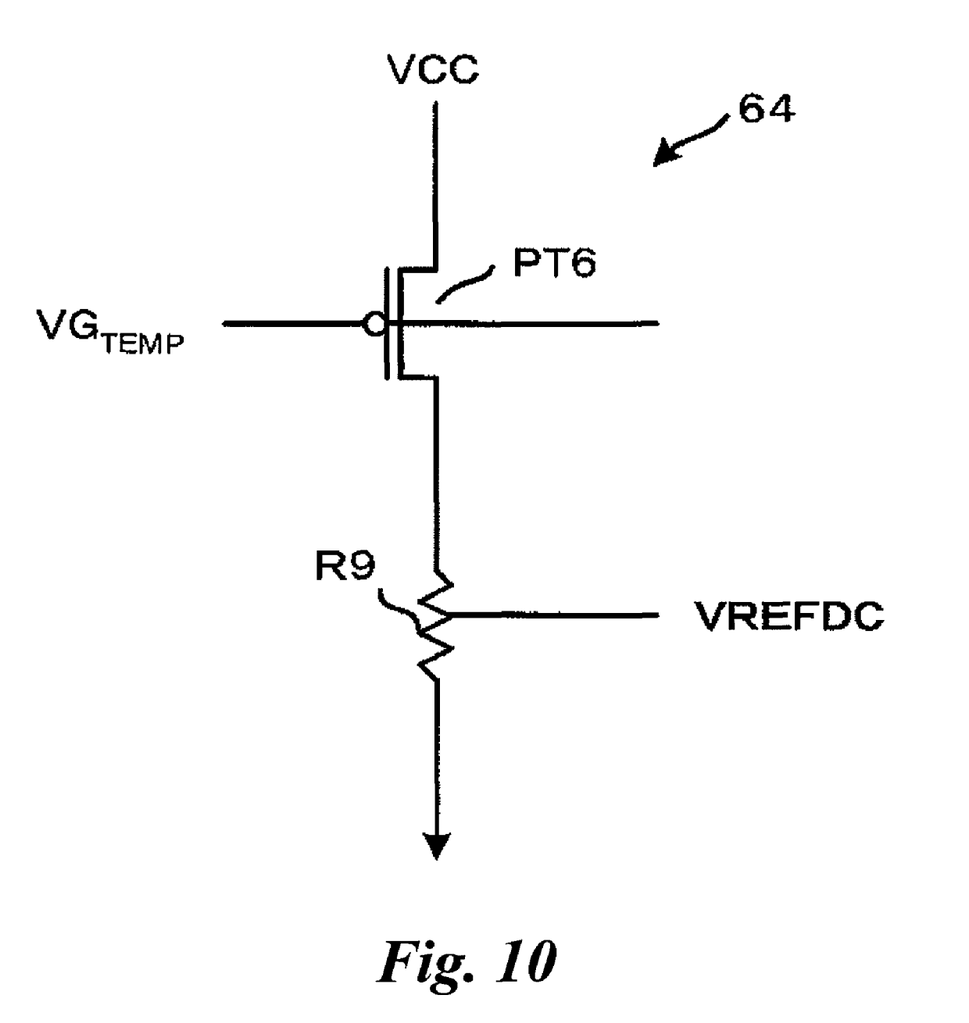
FIG. 10 illustrates a VREFDC generation circuit of the nonvolatile semiconductor memory device according to Embodiment 2.

As illustrated in FIG. 10, the VREFDC generation circuit 64 includes a PMOS transistor PT6 and a resistor R9 connected in series with each other. The source of the PMOS transistor PT6 is connected to a high-side power supply Vcc. The VGTEMP voltage (first voltage) of the VBGR generation circuit 63 is supplied to the gate of the PMOS transistor PT6.

In the semiconductor chip 61, when the temperature of the peripheral portion 61b on which the PMOS transistor PT6 is formed is higher than the central portion 61a on which the VBGR generation circuit 63 is formed, the threshold of the PMOS transistor PT6 is lowered. Thus, current flowing in the resistor R9 increases, and the VREFDC voltage increases. A variable resistor is used as the resistor R9 to be able to adjust the VREFDC voltage.

Thus, the VREFDC voltage (second voltage) can be obtained so that the temperature dependence at the peripheral portion 61b is imparted to the VGTEMP voltage (first voltage) having the temperature dependence at the central portion 61a.

The configuration of the VREFDC generation circuit is not limited to as that shown in FIG. 10. For example, as shown in FIG. 9, the VREFDC generation circuit 164 may be used to generate the VREFDC voltage. The VREFDC generation circuit 164 includes an operational amplifier OP3, the PMOS transistor PT5 and the resistor R8, and the VREFDC voltage is obtained therethrough.

Figure 11:
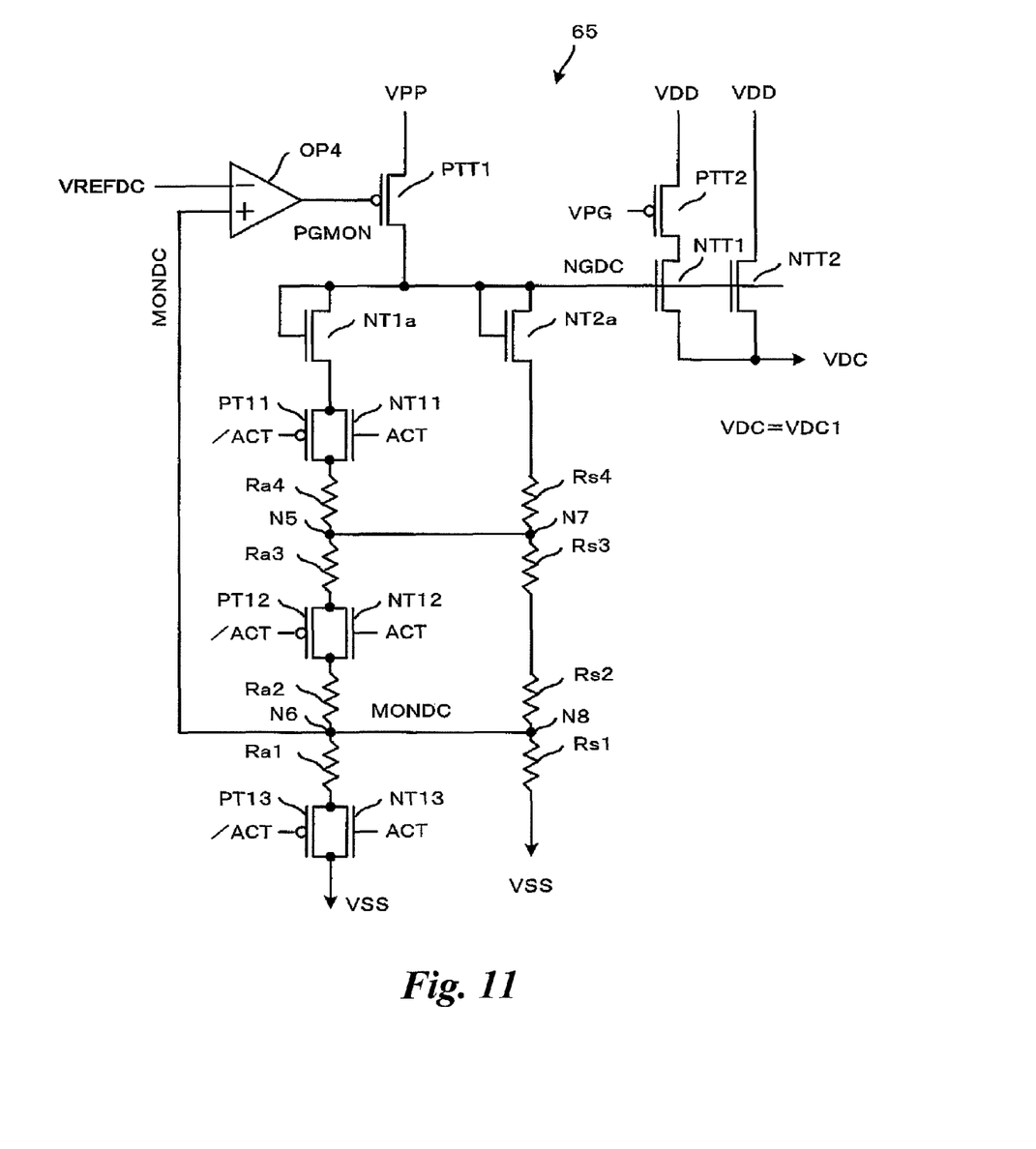
FIG. 11 illustrates a VDC generation circuit of the nonvolatile semiconductor memory device according to Embodiment 2.

As illustrated in FIG. 11, the VDC generation circuit 65 includes an operational amplifier (differential amplifier circuit) OP4, NMOS transistors NT1a, NT2a, NTT1, NTT2 and NT11 to NT13, PMOS transistors PTT1, PTT2, PT11 to PT13, and resistors Ra1 to Ra4 and Rs1 to Rs4.

For example, in the VDC generation circuit 65, a high-side power supply voltage VDD serving as the external power supply voltage is input to the source of the PMOS transistor PTT2 and to the drain of the NMOS transistor NTT2, a high-side power supply voltage VPP serving as the wordline stepped-up power supply voltage is input to the source of the PMOS transistor PPT1, and the output voltage VDC serving as the stepped-down internal power supply voltage is output to the first dummy plate line DPL1 as the first dummy plate voltage CDV2.

The operational amplifier OP4 is configured such that a feedback voltage MONDC is input to a non-inverting input terminal (input-side (+) port), that a reference voltage VREFDC is input to an inverting input terminal (input-side (−) port), and that a differentially-amplified signal is output as a control signal PGMON.

When the feedback voltage MONDC is lower than the reference voltage VREFDC, a control signal PGMON is at level "L". When the feedback voltage MONDC is higher than the reference voltage VREFDC, the control signal PGMON is at level "H".

The high-side power supply voltage VPP is input to the source of the PMOS transistor PTT1, while the control signal PGMON output from the operational amplifier OP4 is input to the gate of the PMOS transistor PTT1. When the high-side power supply voltage VPP is at level "L", the PMOS transistor PTT1 is turned on, so that an output voltage (gate voltage) NGDC is output from the drain of the PMOS transistor PTT1. A high-side power supply voltage VDD is input to the source of the PMOS transistor PTT2, while a control signal VPG is input to the gate of the PMOS transistor PTT2.

The output voltage (gate voltage) NGDC is input to the drain of the NMOS transistor NT1a. The gate of the NMOS transistor NT1a is connected to the drain thereof. Thus, the NMOS transistor NT1a functions as a diode-connected mirror transistor.

The output voltage (gate voltage) NGDC is input to the drain of the NMOS transistor NT2a. The gate of the NMOS transistor NT2a is connected to the drain thereof. Thus, the NMOS transistor NT2a functions as a diode-connected mirror transistor.

The drain of the NMOS transistor NTT1 is connected to the drain of the PMOS transistor PTT2, and the output voltage (gate voltage) NGDC is input to the gate of the NMOS transistor NTT1. Thus, the NMOS transistor NTT1 is functioning as a source follower type output transistor that outputs the output voltage VDC as a stepped-down internal power supply voltage when the control signal VPG is active.

The high-side power supply voltage VDD is input to the drain of the NMOS transistor NTT2, and the output voltage (gate voltage) NGDC is input to the gate of the NMOS transistor NTT2. Thus, the MOS transistor NTT2 is functioning as a source follower type output transistor that outputs the output voltage VDC as a stepped-down internal power supply voltage at a standby time and an active time.

Current always flows toward the low-side power supply VSS from the NMOS transistor NT2a. On the other hand, current flows toward the low-side power supply VSS from the NMOS transistor NT1a at an active time (i.e., a control signal ACT is "H", and a control signal /ACT is "L"). A feedback voltage MONDC obtained through a resistor division is input to a non-inverting input terminal of the operational amplifier OP4 from nodes N6 and N8.

The VDC generation circuit 65 outputs the source voltages of the source follower type output stage transistors (i.e., the NMOS transistors NTT1 and NTT2) stepping down the power supply voltage as the voltage VDC (i.e., as a stepped-down internal power supply voltage), by controlling the gate voltage and the source voltage of diode-connected mirror transistors (i.e., the NMOS transistors NT1a and NT2a) on condition that the source voltages of the mirror transistors are matched with each other.

As described above, the reference voltage generation circuit 50 of the nonvolatile semiconductor memory device 60 according to the present embodiment includes the first dummy cell 53 configured to have the paraelectric capacitor 51 such that one terminal of the paraelectric capacitor 51 is connected to the first dummy plate line DPL1 having the first dummy plate voltage VDC1 depending on both the temperature dependence of the first region of the semiconductor chip and that of the second region spaced apart from the first region, and that the other terminal of the paraelectric capacitor 51 is connected via the transistor 52 to the reference bitline /BL of the bitline pair, from which data stored in the memory cell is not read.

In the semiconductor chip 61 on which the nonvolatile semiconductor memory device 60 is formed, the memory cell arrays 62 are disposed at four places, the VBGR generation circuit 63 for generating the VGTEMP voltage depending on the temperature of the central portion 61a is disposed at the central portion 61a, and the VREFDC generation circuit 64 for generating the VREFDC voltage obtained by imparting the temperature dependence of the corresponding peripheral portion 61b to the VGTEMP voltage and the VDC generation circuit 65 for generating the first dummy plate voltage VDC1 according to the VREFDC voltage are disposed at each peripheral portion 61b.

In the embodiment, reference charge depending on temperature can be generated by the paraelectric capacitor 51. In addition, when a temperature distribution is caused in the semiconductor chip 61, the reference voltage VDC can be automatically adjusted according to each location.

According to an aspect of the present invention, there is obtained a nonvolatile semiconductor memory device including a reference voltage generation circuit having power-supply voltage dependence and temperature dependence.

What is claimed is:

1. A nonvolatile semiconductor memory device comprising:
    a memory cell array comprising:
        a plurality of memory cell blocks comprising a memory cell;
        a word line connected to the memory cell of each of the memory cell blocks; and
        a bitline pair connected to the memory cell blocks comprising a readout bitline and a reference bitline;
    an amplifier connected to the bitline pair configured to amplify a signal difference between the readout bitline and the reference bitline; and
    a reference voltage generator comprising:
        a first dummy cell comprising a dummy memory cell block of the same configuration as the memory cell block comprising a first terminal connected to a first dummy plate line and a second terminal connected to the reference bitline of the bitline pair; and
        a second dummy cell comprising a paraelectric capacitor comprising a first terminal connected to a second dummy plate line and a second terminal connected to the reference bitline of the bitline pair.

2. The nonvolatile semiconductor memory device of claim 1,
    wherein the memory cell comprises:
        a cell transistor; and
        a ferroelectric capacitor connected between a source and a drain of the cell transistor, and
    wherein the wordline is connected to a gate of the cell transistor.

3. The nonvolatile semiconductor memory device of claim 1,
    wherein a first dummy plate voltage of the first dummy plate line is substantially the same as an array voltage.

4. The nonvolatile semiconductor memory device of claim 1,
    wherein a second dummy plate voltage of the second dummy plate line is configured to vary according to an array voltage.

5. The nonvolatile semiconductor memory device of claim 4,
    wherein the second dummy plate voltage is k times as low as the array voltage where k satisfies 0<k<1.

6. The nonvolatile semiconductor memory device of claim 5,
    wherein k is substantially equal to or greater than 0.8 and substantially smaller than or equal to 0.95.

7. The nonvolatile semiconductor memory device of claim 6,
    wherein k is substantially equal to 0.9.

8. The nonvolatile semiconductor memory device of claim 1,
    wherein the second terminal of the dummy memory cell block is connected to the reference bitline via a block selector, and
    wherein the second terminal of the paraelectric capacitor is connected to the reference bitline via a selection transistor.

9. The nonvolatile semiconductor memory device of claim 1,
    wherein data "0" is written to the first dummy cell after reading data.

10. The nonvolatile semiconductor memory device of claim 1,
    wherein the reference voltage generator is configured to generate an intermediate voltage between a readout voltage of "0" data and a readout voltage of "1" data.

11. A nonvolatile semiconductor memory device comprising:
    a semiconductor substrate comprising a first region and a second region;
    a memory cell array comprising:
        a plurality of memory cell blocks comprising a plurality of memory cells;
        a plurality of wordlines connected to the memory cells of the memory cell blocks; and
        a bitline pair connected to the memory cell blocks comprising a readout bitline and a reference bitline;
    an amplifier connected to the bitline pair configured to amplify a signal difference therebetween; and
    a reference voltage generator comprising:
        a first dummy cell comprising a first paraelectric capacitor comprising a first terminal connected to a first dummy plate comprising a first dummy plate voltage according to temperatures of the first and the second regions and a second terminal connected to the reference bitline of the bitline pair; and
        a second dummy cell comprising a second paraelectric capacitor comprising a second dummy plate voltage according to an array voltage and a second terminal connected to the reference bitline of the bitline pair.

12. The nonvolatile semiconductor memory device of claim 11,
    wherein the reference voltage generator is configured to generate an intermediate voltage between a readout voltage of "0" data and a readout voltage of "1" data.

13. The nonvolatile semiconductor memory device of claim 11,
    wherein the second dummy plate voltage is k times as low as the array voltage where k satisfies 0<k<1.

14. The nonvolatile semiconductor memory device of claim 11,
    wherein the first region comprises a central region of the semiconductor substrate, and
    wherein the second region comprises a peripheral region of the semiconductor substrate.

15. The nonvolatile semiconductor memory device of claim 11, further comprising:
    a first voltage generator on the first region configured to generate a first voltage according to the temperature of the first region;
    a second voltage generator on the second region configured to generate a second voltage according to the temperature of the second region based on the first voltage; and
    a third voltage generator configured to generate the first dummy plate voltage based on the second voltage.

16. The nonvolatile semiconductor memory device of claim 11,
    wherein the first dummy plate voltage comprises a temperature dependence corresponding to an intermediate value between data "0" and data "1" read from the memory cell.

17. The nonvolatile semiconductor memory device of claim 1,
    wherein each memory cell block comprises a plurality of serially-connected memory cells, and wherein the word line comprises a plurality of word lines connected to the memory cells of the memory cell blocks, respectively.

18. The nonvolatile semiconductor memory device of claim 11, wherein the plurality of memory cells in each memory cell block are serially-connected.

19. A nonvolatile semiconductor memory device comprising:
- a memory cell array comprising:
  - a memory cell;
  - a word line connected to the memory cell;
  - a readout bitline connected to the memory cell; and
  - a reference bitline;
- an amplifier connected to the readout bitline and the reference bitline configured to amplify a signal difference between the readout bitline and the reference bitline; and
- a reference voltage generator comprising:
  - a first dummy cell having the same configuration as the memory cell comprising a first terminal connected to a first dummy plate line and a second terminal connected to the reference bitline; and
  - a second dummy cell comprising a paraelectric capacitor comprising a first terminal connected to a second dummy plate line and a second terminal connected to the reference bitline.

* * * * *